United States Patent
Narendra et al.

(10) Patent No.: US 7,075,180 B2
(45) Date of Patent: Jul. 11, 2006

(54) METHOD AND APPARATUS FOR APPLYING BODY BIAS TO INTEGRATED CIRCUIT DIE

(75) Inventors: Siva G. Narendra, Portland, OR (US); James W. Tschanz, Portland, OR (US); Victor Zia, Beaverton, OR (US); Badarinath Kommandur, Hillsboro, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 213 days.

(21) Appl. No.: 10/747,805

(22) Filed: Dec. 29, 2003

(65) Prior Publication Data

US 2005/0139999 A1    Jun. 30, 2005

(51) Int. Cl.
*H01L 23/10*    (2006.01)
*H01L 23/34*    (2006.01)

(52) U.S. Cl. .................... 257/707; 257/717; 257/719; 257/778

(58) Field of Classification Search ............... 257/707, 257/717, 719, 778, 706
See application file for complete search history.

(56) References Cited

U.S. PATENT DOCUMENTS 5,287,247 A * 2/1994 Smits et al. ................ 361/707

* cited by examiner

*Primary Examiner*—Thien F. Tran
(74) *Attorney, Agent, or Firm*—Buckley, Maschoff & Talwalkar LLC

(57) ABSTRACT

In some embodiments, a method includes providing an integrated circuit (IC) die in a package. The IC die may have a metal layer on a back surface of the IC die. The method may also include applying a bias signal to the IC die via the metal layer.

18 Claims, 4 Drawing Sheets

METHOD AND APPARATUS FOR APPLYING BODY BIAS TO INTEGRATED CIRCUIT DIE

BACKGROUND

It may be advantageous to apply a body bias signal to some semiconductor devices. For example, it has been proposed to apply body bias signals in connection with certain device testing procedures to improve the sensitivity of the test. According to another proposal, body biasing may be employed to adjust the operating frequency of a semiconductor device to meet frequency specifications.

One drawback to applications that call for body biasing of semiconductor devices may reside in a possible requirement that the layout of the device be substantially modified to accommodate a grid to which the bias signal may be applied. The modification of the device layout to accommodate such a grid may potentially involve months of layout design work, with a corresponding delay in time-to-market.

DETAILED DESCRIPTION

In some embodiments, an IC die (or a wafer from which the die is cut) may be processed so as to remove insulating oxides or nitrides from the back surface of the die. A metal layer may be applied to the back surface after the thinning process which removed the insulating layer, and the die may then be packaged in such a manner as to allow a bias signal to be applied to the back surface of the die to apply body bias to the semiconductor device on the die.

Figure 1:
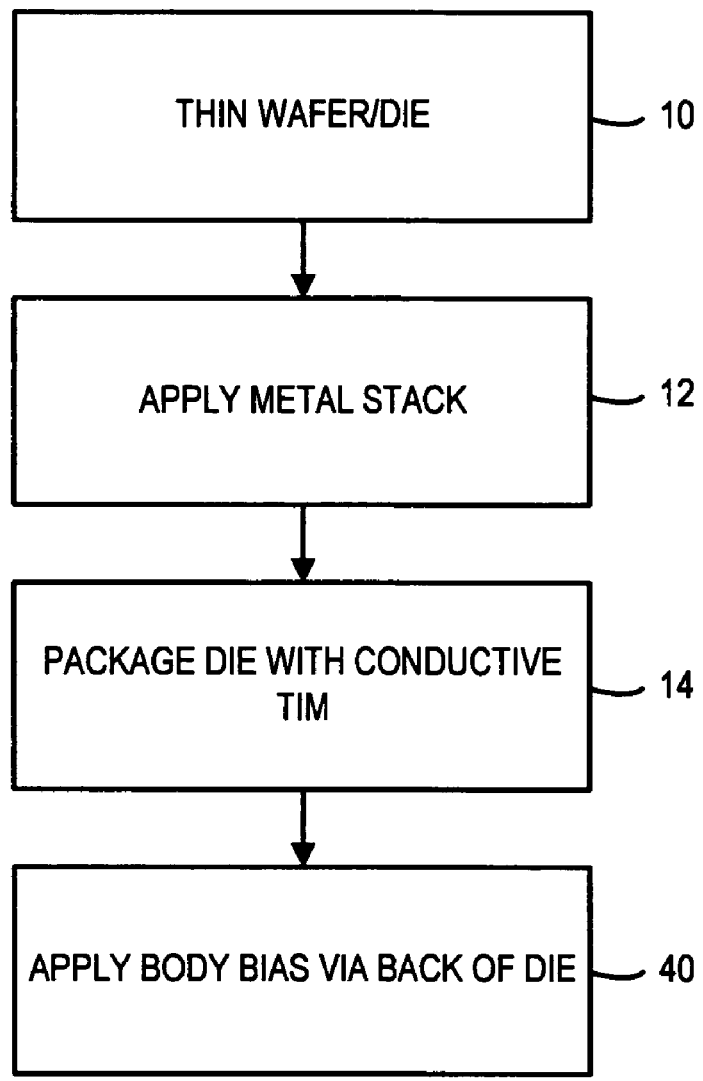
FIG. 1 is a flow chart that illustrates at least some of a process for applying a body bias signal to an integrated circuit (IC) according to some embodiments.

FIG. 1 is a flow chart that illustrates at least some portions of a process for applying a body bias signal to an IC according to some embodiments.

As indicated at 10 in FIG. 1, a semiconductor wafer, or a die cut from a wafer, may be thinned to remove oxides and/or nitrides from a back side of the wafer or die. This may be done after all processes to be performed on the front of the wafer are complete. That is, the thinning of the wafer may occur after all devices are formed on the face of the wafer, and all signal traces, vias, etc. have been formed, and connection bumps (e.g., solder bumps) have been formed on the face of the wafer. The thinning may be performed using conventional equipment for grinding away the surface of a semiconductor wafer or die. In some embodiments, the wafer or die may be formed of silicon.

After the thinning of the wafer or die, at least one metal layer may be formed on the back surface of the wafer or die, as indicated at 12 in FIG. 1. For example, in some embodiments, a stack of three or more layers of different metals may be formed. In some embodiments, the stack may include a first layer, positioned directly on the back surface of the die or wafer, and formed of titanium. Next in the stack may be a second (middle) layer, of nickel-vanadium, formed on the titanium layer. Then, there may be a third (outer) layer, of gold, formed on the nickel-vanadium layer. These metal layers may be formed by plating, sputtering or any other suitable process.

It will be appreciated that in a stack of three layers as just described, the lowest (e.g., titanium) layer may be compatible with the semiconductor material of the die. The outer layer (e.g., gold) may be compatible with material that may be used to electrically couple the die to the packaging for the die. The middle layer (e.g., nickel-vanadium) may provide a suitable interface between the lowest layer of the stack and the outer layer of the stack.

In other embodiments, more or fewer than three metal layers may be applied to the back surface of the die or wafer. For example, a two-layer stack may be formed, with a lower layer of titanium, and an outer layer of gold or solder. In still another embodiment, just a single layer may be formed of, e.g., titanium.

Figure 2:
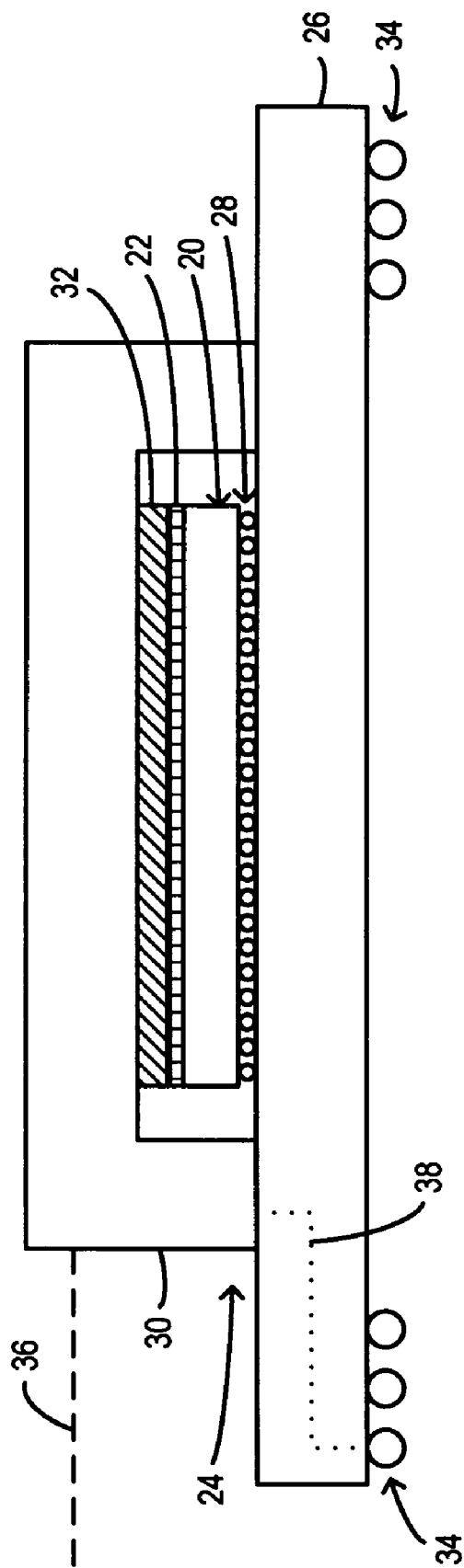
FIG. 2 is a schematic side cross-sectional view that illustrates an IC die and associated package according to some embodiments.

After the metal stack (or single metal layer, as the case may be) is applied to the back surface of the thinned die or wafer (and after cutting of the wafer into die, if such has not previously occurred) the resulting die may be packaged, as indicated at 14 in FIG. 1. FIG. 2 is a schematic cross-sectional view of a packaged IC die according to some embodiments. In FIG. 2, reference numeral 20 indicates the die which has been thinned and to which the metal stack or layer has been applied. Reference numeral 22 indicates the metal stack or layer on the back surface of the die 20. (It will be appreciated that FIG. 2 is not necessarily drawn to scale and that the metal stack or layer 22 may be thinner than it appears to be in FIG. 2.).

Reference numeral 24 generally indicates the package in which the die 20 is mounted. The package 24 includes a package substrate 26 to which the die 20 is mounted in flip-chip fashion by die bumps 28 provided on the face of the die 20. (As used herein and in the appended claims, "flip-chip" refers to a microelectronic assembly practice in which an IC die is directly mounted face-down on a substrate or other surface by mean of conductive bumps on die bond pads.) The mounting of the die 20 via die bumps 28 on the package substrate 26 may be in accordance with conventional practices. The number of die bumps 28 may be more or fewer than the number depicted in the drawing.

The package 24 also includes a heat spreader 30 which is thermally and electrically coupled to the die 20 by a thermal interface material (TIM) 32. The TIM 32 may, for example, be a layer of solder or other material that is both thermally and electrically conductive. The TIM 32 may couple the heat spreader 30 to the back surface of the die 20 via the metal stack or layer 22.

The package 24 may also include package bumps 34 provided on a lower surface of the package substrate 26 to allow the package 24 to be mounted on and interfaced to a circuit board (not shown) or the like. The number of package bumps 34 may be more or fewer than the package bumps depicted in the drawing.

In some embodiments, the package 24 may include an electrically conductive connection which is coupled to the heat spreader 30 and which is represented by dashed line 36. The conductive connection 36 may, for example, take the form of a wire that is independent of (i.e., not a part of) the package substrate 26. A purpose of the conductive connection 36 is to allow the heat spreader 30 to be coupled to a source (not shown in FIG. 2) of a bias signal to be applied to the body of the die 20 via the TIM 32 and the metal stack or layer 22.

In other embodiments, an alternative electrically conductive connection to the heat spreader may be provided in the form of one or more traces and/or vias that form a conductive path which passes through the package substrate 26. This alternative conductive connection is represented by dotted line 38. The alternative conductive connection 38, if present, may allow the heat spreader 30 to be coupled to the bias signal source (not shown in FIG. 2) via one or more package bumps 34 and via the circuit board (not shown) to which the package 24 is mounted by the package bumps 34.

Referring once more to FIG. 1, and as indicated at 40 in FIG. 1, a bias signal may be applied to the body of die 20 via the conductive connection 36 or 38, via the heat spreader 30, via the TIM 32 and via the metal stack or layer 22.

Figure 3:
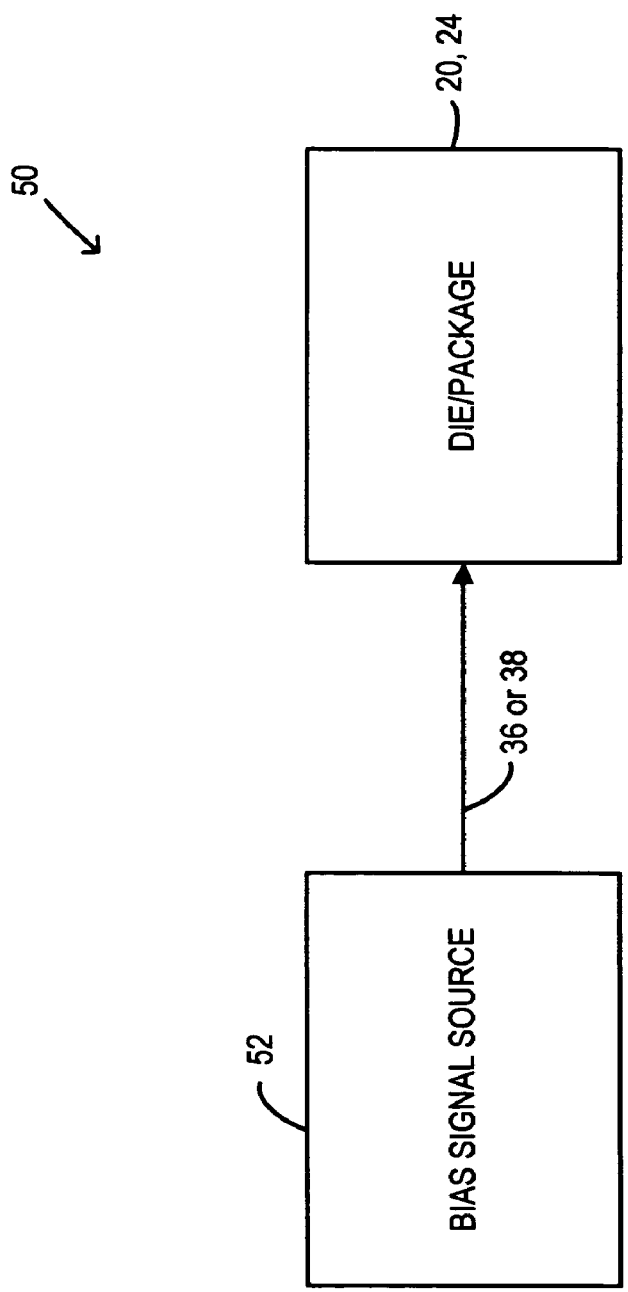
FIG. 3 is a block diagram representation of an apparatus that includes the IC die and package of FIG. 1.

FIG. 3 is a block diagram representation of an apparatus 50 that includes the IC die 20 and package 24. The apparatus 50 also includes an off-chip source 52 of a bias signal. The bias signal source 52 is coupled to the package 26 and the die 20 by conductive connection 36 or 38 and/or other suitable conductive signal path. More specifically, the bias signal source 52 may be coupled to the back surface of the die 20 via a conductive connection 36 or 38, via heat spreader 30, via TIM 32 and via metal stack or layer 22. Thus the bias signal source may apply a body bias to the die 20 via the back surface of the die 20.

In some embodiments, the die 20 may comprise a microprocessor (not separately shown) with a floating p-substrate (not shown), assuming an n-well process is employed for the die 20. That is, the microprocessor may be produced in such a manner that the p-substrate is electrically isolated from the $V_{SS}$ power supply of the microprocessor. This may be done by a fabrication process that can readily be designed by those who are skilled in the art. In this example, all NMOS devices (not shown) on the die share a common p-substrate, and the bias signal from the bias signal source 52 biases the body terminal of the NMOS devices. Alternatively, with a p-well process, all PMOS devices (not shown) on the die may be body-biased with the signal from the bias signal source 52 via a common n-substrate (not shown) for the PMOS devices.

In embodiments described herein, an IC may be body biased via the back surface of the IC die. Consequently, an IC suitable for body-biasing may be provided without a body bias grid incorporated in the layout of the IC. As a result, it may not be necessary to engage in an extensive, time-consuming re-design of the IC layout in order to adapt an IC for body bias. Improved time-to-market may thereby be achieved. Thus the advantages that may be available from body biasing may be realized at reduced cost and reduced time-to-market. Among these advantages may be improved IC testing procedures, leakage suppression, and adaptive operating frequency adjustment.

Furthermore, the removal of the insulating oxides and nitrides from the back surface of the die may reduce the thermal resistance of the heat transmission path to the heat spreader. As a result, the heat dissipation characteristics of the IC and its packaging may be improved. Thus, for a target junction temperature, the power dissipation capacity of the IC and its packaging may be increased, or a lower junction temperature may be realized for the same amount of power dissipated.

Figure 4:
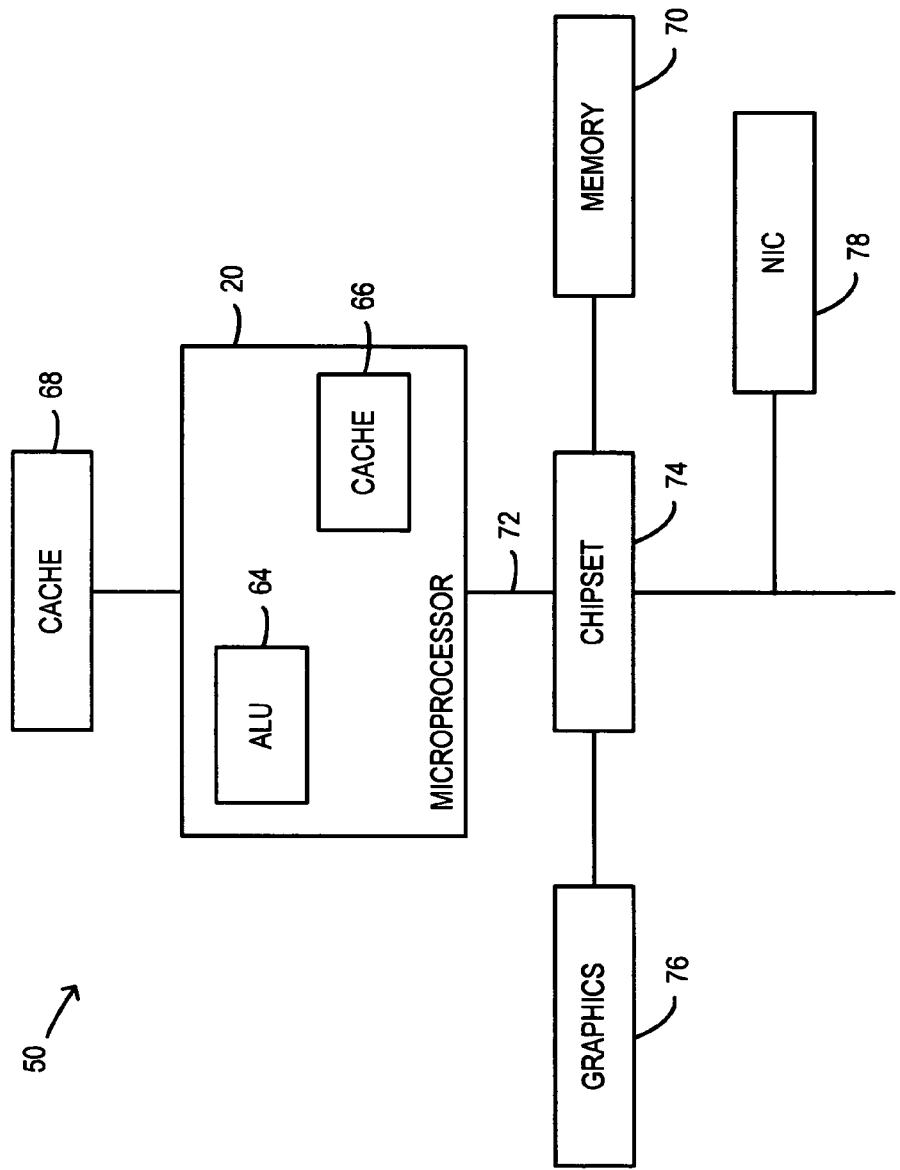
FIG. 4 is an alternative block diagram representation of the apparatus of FIG. 3.

FIG. 4 is an alternative block diagram representation of the apparatus 50.

As seen from FIG. 4, the apparatus 50 may be viewed as a system, including the die 20, which in this case is assumed to be a microprocessor die. The microprocessor die may comprise many sub-blocks, such as arithmetic logic unit 64 and on-die cache 66. Microprocessor 20 may also communicate to other levels of cache, such as off-die cache 68. Higher memory hierarchy levels, such as system memory 70, are accessed via host bus 72 and chipset 74, which is in communication with microprocessor 20 via host bus 72. In addition, other off-die functional units, such as graphics accelerator 76 and network interface controller (NIC) 78, to name just a few, may communicate with microprocessor 20 via appropriate busses or ports.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. An apparatus comprising:
   an integrated circuit (IC) die;
   a stack of at least three metal layers on a back surface of the IC die, said three metal layers including a first layer formed of a first material, a second layer formed of a second material different from the first material and a third layer formed of a third material different from the first and second materials;
   a heat spreader conductively coupled to the stack of metal layers; and
   a bias signal source coupled to the heat spreader to supply a bias signal to the IC die via the stack of metal layers.

2. The apparatus of claim 1, further comprising:
   a wire coupled to the heat spreader to provide the bias signal from the signal source.

3. The apparatus of claim 1, further comprising:
   a package substrate on which the IC die is mounted, the package substrate including a conductive path to provide the bias signal to the heat spreader.

4. The apparatus of claim 1, wherein the IC die includes a microprocessor.

5. An article of manufacture, comprising:
   a substrate;
   an integrated circuit (IC) die mounted on the substrate;
   a metal layer on a back surface of the IC die;
   a heat spreader electrically coupled to the metal layer;
   an electrically conductive connection to couple the heat spreader to a device external to the IC die; and
   a layer of solder between the metal layer and the heat spreader.

6. The article of manufacture of claim 5, wherein the electrically conductive connection passes through the substrate.

7. The article of manufacture of claim 5, wherein the electrically conductive connection includes a wire that is not part of the substrate.

8. The article of manufacture of claim 5, wherein the IC die includes a microprocessor.

9. The article of manufacture of claim 5, wherein the IC die is mounted in flip-chip fashion on the substrate.

10. An article of manufacture, comprising:
    a substrate;
    an integrated circuit (IC) die mounted on the substrate;
    a metal layer on a back surface of the IC die;
    a heat spreader electrically coupled to the metal layer;
    means for providing a signal path between the heat spreader and a device external to the IC die; and
    a layer of solder between the metal layer and the heat spreader.

11. The article of manufacture of claim 10, wherein the means for providing a signal path includes a wire coupled to the heat spreader.

12. The article of manufacture of claim 10, wherein the means for providing a signal path includes a conductive path that passes through the substrate.

13. The article of manufacture of claim 10, wherein the IC die includes a microprocessor.

14. The article of manufacture of claim 10, wherein the IC die is mounted in flip-chip fashion on the substrate.

15. A system comprising:
   a die comprising a microprocessor; and
   a chipset in communication with the microprocessor; wherein:
      the die has a metal layer on a back surface of the die; and
      the die is mounted in a package that includes:
         a substrate on which the die is mounted;
         a heat spreader electrically coupled to the metal layer;
         an electrically conductive connection to couple the heat spreader to a device external to the die; and
         a layer of solder between the metal layer and the heat spreader.

16. The system of claim 15, wherein the electrically conductive connection passes through the substrate.

17. The system of claim 15, wherein the electrically conductive connection includes a wire that is not part of the substrate.

18. The system of claim 15, wherein the die is mounted in flip-chip fashion on the substrate.

* * * * *